(12) United States Patent
Jerebic et al.

(10) Patent No.: US 7,397,111 B2
(45) Date of Patent: Jul. 8, 2008

(54) SEMICONDUCTOR WAFER, AN ELECTRONIC COMPONENT, AND A COMPONENT CARRIER FOR PRODUCING THE ELECTRONIC COMPONENT

(75) Inventors: Simon Jerebic, Regensburg (DE); Jens Pohl, Bernhardswald (DE); Horst Theuss, Wenzenbach (DE)

(73) Assignee: Infineon Technologies, AG, Neubiberg (DE)

( * ) Notice: Subject to any disclaimer, the term of this patent is extended or adjusted under 35 U.S.C. 154(b) by 188 days.

(21) Appl. No.: 11/291,072

(22) Filed: Dec. 1, 2005

(65) Prior Publication Data

US 2006/0131712 A1 Jun. 22, 2006

Related U.S. Application Data

(63) Continuation of application No. PCT/DE2004/001090, filed on May 26, 2004.

(30) Foreign Application Priority Data

Jun. 4, 2003 (DE) ................................. 103 25 541

(51) Int. Cl.
 *H01L 23/552* (2006.01)
 *H01L 21/00* (2006.01)
(52) U.S. Cl. .................. 257/659; 257/660; 257/684; 257/108; 257/E29.167; 257/E21.665; 174/353; 361/133; 29/603.13; 29/719; 29/737; 29/744; 324/331; 324/377; 324/463; 324/210; 324/219; 438/378; 438/795

(58) Field of Classification Search ............... 257/108, 257/E29.167, E21.665, 294, 414, 421, 425, 257/428, 659, 660; 29/603.13, 719, 737, 29/744; 174/353; 324/331, 377, 463, 210, 324/219, 529; 361/133; 438/3
See application file for complete search history.

(56) References Cited

U.S. PATENT DOCUMENTS

| | | | |
|---|---|---|---|
| 3,612,955 A | 10/1971 | Butherus et al. | |
| 3,963,489 A * | 6/1976 | Cho | 430/22 |
| 4,695,795 A | 9/1987 | Nakamazo et al. | |
| 5,561,265 A | 10/1996 | Livshits et al. | |
| 6,759,248 B2 * | 7/2004 | Mautz et al. | 438/3 |
| 7,075,163 B2 * | 7/2006 | Yoshida et al. | 257/428 |
| 2002/0030249 A1 | 3/2002 | Yoshida et al. | |
| 2005/0249314 A1 | 11/2005 | Bock | |

FOREIGN PATENT DOCUMENTS

| | | | |
|---|---|---|---|
| JP | 59096741 | | 6/1982 |
| JP | 63208226 | | 8/1988 |
| JP | 4-211998 | * | 4/1992 |
| JP | 2002057433 | | 8/2002 |

* cited by examiner

*Primary Examiner*—Jasmine J Clark
(74) *Attorney, Agent, or Firm*—Edell, Shapiro & Finnan, LLC

(57) ABSTRACT

An electronic component includes a semiconductor chip with a chip topside, an integrated circuit, and a chip backside. The chip backside includes a magnetic layer. The electronic component further includes a chip carrier with a magnetic layer on its carrier topside. At least one of the two magnetic layers is permanently magnetic such that the semiconductor chip is magnetically fixed on the chip carrier.

17 Claims, 1 Drawing Sheet

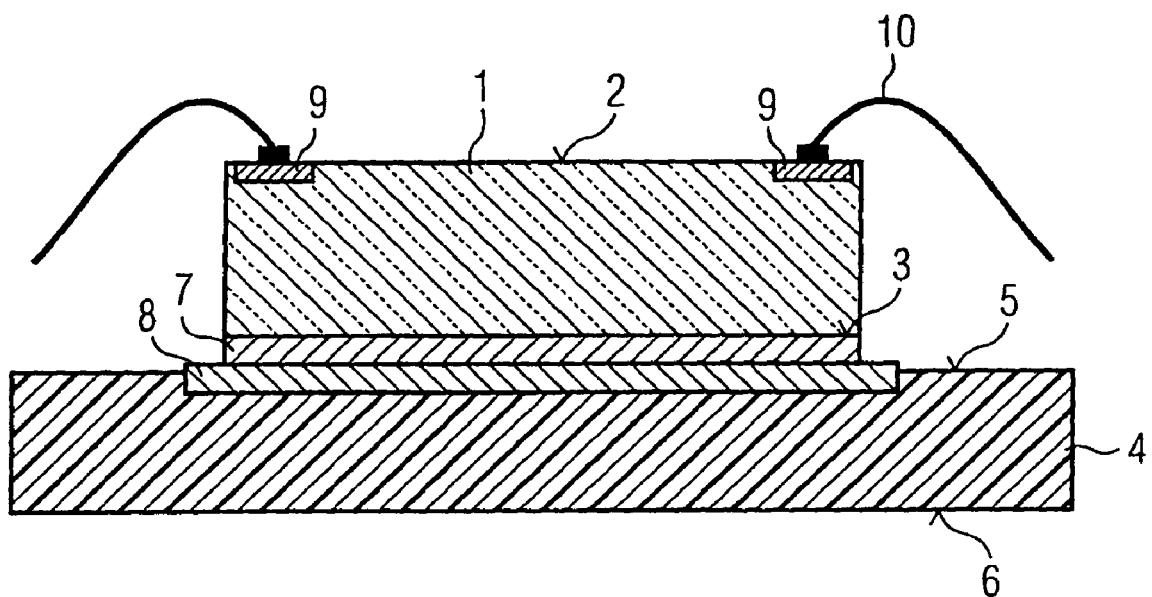

SEMICONDUCTOR WAFER, AN ELECTRONIC COMPONENT, AND A COMPONENT CARRIER FOR PRODUCING THE ELECTRONIC COMPONENT

CROSS REFERENCE TO RELATED APPLICATIONS

This application is a continuation of International Application No. PCT/DE2004/001090, filed on May 26, 2004, and titled "Electronic Component, as well as a Semiconductor Wafer and a Component Carrier For Producing the Component," and further claims priority under 35 USC § 119 to German Application No. DE 103 25 541.9, filed on Jun. 4, 2003, and titled "Electronic Component, as well as a Semiconductor Wafer and a Component Carrier For Producing the Component," the entire contents of which are hereby incorporated by reference.

FIELD OF THE INVENTION

The invention relates to electronic components, as well as to a semiconductor wafer and a component carrier for producing such components, which have a semiconductor chip with an integrated circuit and with a chip backside that is mounted on a chip carrier.

BACKGROUND

By mounting the semiconductor chip on the chip carrier, the semiconductor chip and chip carrier are fixed on one another rigidly in all three spatial directions via soldered or bonded connections. This rigid mechanical connection can tear upon thermal stressing. Microcracks or microgaps form as far as mechanical delamination of the semiconductor chip from the chip carrier. The formation of microcracks or microgaps gives rise to regions in which moisture collects and is stored such that malfunctioning of the electronic component can occur.

SUMMARY

It is an object of the invention to provide an electronic component in which peak stresses between semiconductor chip and chip carrier can be reduced without the occurrence of electronic malfunctioning of the electronic component.

The above and further objects are achieved in accordance with the invention with an electronic component comprising a semiconductor chip including a chip topside, an integrated circuit, and a chip backside. This semiconductor chip is arranged on a carrier topside of a chip carrier that further includes a carrier backside. The chip backside and the carrier topside each include a magnetic layer, and at least one of the two layers is permanently magnetic.

The permanently or permanent magnetic state can be achieved by appropriate magnetization of magnetically hard material. Different polarities and different layer regions can be achieved simultaneously upon magnetization by aligning the Weisschen zones in the magnetically hard material.

The above and still further objects, features and advantages of the present invention will become apparent upon consideration of the following detailed description of specific embodiments thereof, particularly when taken in conjunction with the accompanying drawing.

BRIEF DESCRIPTION OF THE DRAWINGS

FIG. 1 depicts a side view in cross section of a semiconductor chip on a semiconductor carrier in accordance with the present invention.

DETAILED DESCRIPTION

In accordance with the present invention, an electronic component includes a semiconductor chip with a chip topside, an integrated circuit, and a chip backside. This semiconductor chip is arranged on a carrier topside of a chip carrier that further includes a carrier backside. The chip backside and the carrier topside each include a magnetic layer, and at least one of the two layers is permanently magnetic. The permanently or permanent magnetic state is achieved by appropriate magnetization of magnetically hard material. Different polarities and different layer regions can be achieved simultaneously upon magnetization by aligning the Weisschen zones in the magnetically hard material.

As long as a permanently magnetic state has not been reached, the layer remains magnetic and can be fixed by a permanently magnetic layer. The two layers lying on one another on the chip backside and on the carrier topside can be displaced laterally despite the transverse magnetic fixing. This ensures that no peak stresses occur in the electronic component in the event of different thermal expansion of the semiconductor chip and chip carrier, since upon thermal stressing the component topside can be displaced laterally in relation to the chip backside, and yet an intense thermal contact is maintained between the chip backside and carrier topside such that malfunctioning is avoided.

Ferromagnetic materials and/or ferrimagnetic materials can be used as magnetic layer material. Iron, nickel, cobalt and/or gadolinium as a rare earth can be included as ferromagnetic materials in the magnetic layer, while oxide ceramics are used as ferrimagnetic materials. The ferrimagnetic materials are provided, in particular, for constructing permanently magnetic layers.

In one embodiment of the invention, both the magnetic layer on the chip backside, and the magnetic layer on the carrier topside are permanently magnetic. Here, the permanently magnetic layers have structures that are aligned with radial symmetry, for example in a fashion radially aligned toward a point of symmetry, and have alternating polarity.

Such a patterning and polarization of the permanently magnetic layers has the advantage that when a semiconductor chip with an appropriately patterned magnetic layer on its backside is being placed on a chip carrier with the correspondingly patterned, permanently magnetic layer of corresponding opposite polarity on its carrier topside, it is automatically centered and positioned in the process. When inserting a component carrier that has a number of chip carriers, it is thereby possible to reduce the outlay on production, also since a micromanipulation of the semiconductor chip can be eliminated.

It is possible, furthermore, that the permanently magnetic structures are arranged concentrically on the carrier topside and the semiconductor chip backside and have an alternating polarity. A concentric arrangement, for example of annular segments, has the same effect in principle as a radially symmetric arrangement of radially shaped regions in that the semiconductor chip is fixed automatically on the carrier topside with a corresponding concentric structure.

In accordance with another embodiment of the invention, a semiconductor chip wafer is provided for producing a number of semiconductor chips, the semiconductor wafer including semiconductor chip positions arranged in rows and columns. On its wafer topside, the semiconductor chip includes integrated circuits in the semiconductor chip positions. On the opposite side, the wafer backside, the semiconductor wafer includes a magnetic layer. This magnetic layer can be permanently magnetic and, in particular, this permanently magnetic layer can be patterned in each of the semiconductor chip positions in such a way that regions of different polarity are present in a radially symmetric and/or concentric fashion.

Such a semiconductor wafer has the advantage that, when it is cut along cutting joints of the semiconductor chip positions arranged in rows and columns, it produces a multiplicity of electronic semiconductor chips that are suitable for applying to an appropriately prepared semiconductor chip carrier with a magnetic layer and/or with a permanently magnetic layer. The semiconductor wafer with its structures on the semiconductor chip backside therefore has the advantage that a magnetic layer is already simultaneously present for a large number of semiconductor chips.

In another embodiment of the invention, a component carrier is provided that includes component positions arranged in rows and columns, the component positions including chip carriers with chip carrier topsides and chip carrier backsides. Here, the chip carrier topsides can include magnetic layers, and/or include permanently magnetic patterns with regions of different polarity in a radially symmetric and/or concentric arrangement.

Such a component carrier has the advantage that it can be loaded with appropriately prepared semiconductor chips while, although being fixed in a transverse fashion by the magnetic attraction, these semiconductor chips can be displaced laterally in relation to the chip carrier in the event of thermal stressing. Here, a radially symmetrical and/or concentric arrangement of regions of permanently magnetic layers has the advantage that the semiconductor chip on the chip carrier remains centered with its center on the chip carrier despite different thermal expansion of the chip carrier and semiconductor chip.

In accordance with the invention, a method for producing a semiconductor wafer with a number of semiconductor chip positions for a number of electronic components includes the following method steps. First, a semiconductor wafer with semiconductor chip positions arranged in rows and columns, and with a wafer topside and with a wafer backside is provided. Subsequently, a magnetic layer is applied to the wafer backside. This magnetic layer can be additionally patterned in the semiconductor chip positions such that it includes radially symmetrical and/or concentric regions. Subsequently, these regions can be differently magnetized such that differently polarized permanently magnetic regions are produced. Such a patterning in the semiconductor chip positions is required only after having been cut from the semiconductor wafer, the individual semiconductor chips are to be applied to an appropriate chip carrier in a self-centering fashion. It suffices in principle to coat the semiconductor wafer backside with a magnetic layer made from ferromagnetic or ferrimagnetic materials without any patterning.

One embodiment for producing a component carrier with a number of component positions for a number of electronic components includes the following method steps. First, a component carrier blank with component positions arranged in rows and columns, a component carrier topside and a component carrier backside is provided. This component carrier blank can include a non-magnetic copper or copper alloy plate. However, it can also include a copper-clad printed circuit board. A magnetic layer is applied to this component carrier blank, to the component carrier topside. If this component carrier is prepared for semiconductor chips that already include permanently magnetic layers on their backsides, this suffices for applying only one magnetic layer to the component carrier. However, there is then no automatic centering of the semiconductor chip on the chip carrier. Rather, it is necessary for the semiconductor chip to be positioned on the component carrier with the aid of a micromanipulator.

In order to achieve automatic centering, the magnetic layer is first patterned on the component carrier topside and the patterned magnetic layer is subsequently magnetized into differently polarized permanently magnetic regions. Radially symmetrical and/or coaxially aligned regions can be provided during the patterning and/or during the magnetization, in order to ensure automatic positioning and centering of semiconductor chips on the component carrier.

In order to produce an electronic component with the aid of a prepared and available semiconductor wafer treated according to the above embodiments, the semiconductor wafer need only be separated into individual semiconductor chips. Subsequently, the semiconductor chips can be applied to an appropriately prepared component carrier, with automatic centering of the semiconductor chips being performed, or an alignment and adjustment by a micromanipulator becoming necessary, depending on the preparation of the magnetic layers on the backside of the semiconductor chips and the component carrier topside.

After the semiconductor chips have been fixed on appropriate chip carrier topsides of the component carrier, the semiconductor chips can be wired with the aid of appropriate external contact structures of the component carrier, and the semiconductor chips in the component positions of the component carrier can be packaged to form electronic components such that all that is required as the concluding method step for producing electronic components, is for the component carrier further to be separated into individual electronic components.

This method has the advantage that electronic components are produced in which electric contact with the carrier material is not disturbed, even in the event of displacements of the semiconductor chips in relation to the carrier material owing to thermal stressing, since a lateral displacement between the magnetic layers is possible at any time without reducing the contact pressure between the magnetic layers or increasing the contact resistance. This results in an electronic component whose functionality is not impaired by thermal stressing.

In summary, the technique of bonding or soldering is currently being used to connect the semiconductor chip in an electronic component to a chip carrier. This connection is rigid in all directions, the result of which is that the adhesive force between the carrier and chip suddenly diminishes as soon as a critical stress in the material is exceeded. A gap is produced in which moisture can collect, and this leads to failure of the component. Furthermore, even the adhesives between the semiconductor chip and chip carrier tend to pick up moisture, and this can impair the functionality of an electronic component.

Attempts have therefore been made to date to increase the stability of this rigid connection in all three spatial directions between the carrier and chip so that such cracks do not occur. However, the fundamental vulnerability to microcracks in the case of such electronic components with a semiconductor chip that is rigidly fixed on a chip carrier cannot be excluded.

The present invention implements a connection that permits a lateral displacement of the semiconductor chip and chip carrier as partners in the connection, without the transverse adhesive force diminishing. Thus, on the basis of the present invention a high adhesive force is maintained between both partners in the connection even when the partners in the connection are displaced laterally in relation to one another. In this case, the chip carrier of the component carrier serves as mounting surface for a backside of the semiconductor chip that is coated with a magnetic layer. Only one of the two contact partners must be permanently magnetic in this case, that is to say actively generate a magnetic field. It is therefore sufficient when the other partner can be magnetized in each case.

If the semiconductor chip with such a magnetic layer is brought into contact with a chip carrier with a permanently magnetic layer, the two components are fixed on one another. Even self-centering of the semiconductor chip on the chip carrier can be achieved by fine patterning of the magnetic regions.

An exemplary embodiment of the invention is depicted in FIG. 1. In particular, FIG. 1 shows a fundamental cross section through a semiconductor chip 1 on a semiconductor chip carrier 4. The semiconductor chip 1 includes a chip topside with an integrated circuit whose contact surfaces 9 are connected via bonds 10 to external contacts (not shown) of the electronic component. A chip backside 3 includes a magnetic layer 7. The semiconductor chip 1 is arranged on a chip carrier 4 that for its part has a backside 6 and a topside 5. Arranged on the topside 5 of the chip carrier 4 is a permanently magnetic layer 8 that is magnetized in such a way that the magnetic layer 7 on the chip backside 3 of the semiconductor chip 1 is attracted by the permanently magnetic layer 8 and fixed on the carrier topside 5 of the chip carrier 4.

When the two magnetic layers 7 and 8 have patterned permanently magnetic regions and these are patterned with radial symmetry or concentrically, the semiconductor chip 1 is automatically aligned, centered and fixed on the chip carrier 4 in the predetermined manner.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An electronic component comprising:
   a semiconductor chip including a chip topside, an integrated circuit, and a chip backside; and
   a chip carrier including a carrier topside and a carrier backside, the carrier topside carrying the semiconductor chip;
   wherein each of the chip backside and the carrier topside comprises a magnetic layer, and at least one of the magnetic layers is permanently magnetic.

2. The electronic component of claim 1, wherein each of the magnetic layer on the chip backside and the magnetic layer on the carrier topside comprises permanently magnetic structures that are arranged in a radially symmetrical manner and have an alternating polarity.

3. The electronic component of claim 1, wherein each of the magnetic layer on the chip backside and the magnetic layer on the carrier topside comprises permanently magnetic structures that are arranged concentrically and have an alternating polarity.

4. A semiconductor wafer comprising:
   semiconductor chip positions arranged in rows and columns;
   a wafer topside including integrated circuits in the semiconductor chip positions; and
   a wafer backside including a magnetic layer that is patterned in the semiconductor chip positions and magnetized into a plurality of permanently magnetic regions including at least some regions that are differently polarized with respect to each other.

5. A semiconductor wafer comprising:
   semiconductor chip positions arranged in rows and columns;
   a wafer topside including integrated circuits in the semiconductor chip positions; and
   a wafer backside including a magnetic layer, wherein the magnetic layer is patterned with regions of different polarity, the regions of different polarity being arranged with radial symmetry and/or concentrically.

6. A component carrier comprising component positions arranged in rows and columns, wherein the component positions comprise chip carriers with chip carrier topsides and chip carrier backsides, the chip carrier topsides comprise a magnetic layer, and the magnetic layer comprises a permanently magnetic structure.

7. A method for producing a semiconductor wafer with a number of semiconductor chip positions for a number of electronic components, the method comprising:
   providing a semiconductor wafer including semiconductor chip positions arranged in rows and columns, and the semiconductor wafer further including a wafer topside and a wafer backside;
   applying a magnetic layer to the wafer backside;
   patterning the magnetic layer in the semiconductor chip positions; and
   magnetizing the patterned magnetic layer into a plurality of permanently magnetic regions including at least some regions that are differently polarized with respect to each other.

8. A method for producing a component carrier with a number of component positions for a number of electronic components, the method comprising:
   providing a component carrier blank including component positions arranged in rows and columns, the component carrier blank further including a component carrier topside and a component carrier backside;
   applying a magnetic layer to the component carrier topside;
   patterning the magnetic layer in the component positions; and
   magnetizing the patterned magnetic layer into a plurality of permanently magnetic regions including at least some regions that are differently polarized with respect to each other.

9. A method for producing electronic components with semiconductor chips, the method comprising:
   providing a semiconductor wafer including semiconductor chip positions arranged in rows and columns, and the semiconductor wafer further including a wafer topside and a wafer backside;
   applying a magnetic layer to the wafer backside;
   separating the semiconductor wafer into individual semiconductor chips;
   providing a component carrier blank including component positions arranged in rows and columns, the component carrier blank further including a component carrier topside and a component carrier backside;
   applying a permanently magnetic layer to the component carrier topside;
   applying the semiconductor chips with the magnetic layers of the backsides of the semiconductor chips to the permanently magnetic layer of the component carrier topside in the component positions;

wiring the semiconductor chips with corresponding external contact structures;

packaging the semiconductor chips in the component positions to form electronic components; and separating the component positions of the component carrier into individual electronic components.

10. The method of claim 9, wherein the magnetic layer in each of the semiconductor chip positions and on the component carrier is patterned in the component positions, and the patterned magnetic layer in each of the semiconductor chip positions and on the component carrier is magnetized into a plurality of permanently magnetic regions including at least some regions that are differently polarized with respect to each other.

11. The electronic component of claim 1, wherein at least one permanently magnetic layer comprises a ferrimagnetic material.

12. The electronic component of claim 11, wherein the ferrimagnetic material comprises an oxide ceramic material.

13. The component carrier of claim 6, wherein the permanently magnetic structure comprises a ferrimagnetic material.

14. The component carrier of claim 13, wherein the ferrimagnetic material comprises an oxide ceramic material.

15. The method of claim 9, wherein the permanently magnetic layer of the component carrier topside comprises a ferrimagnetic material.

16. The method of claim 15, wherein the ferrimagnetic material comprises an oxide ceramic material.

17. The electronic component of claim 1, wherein each of the magnetic layers of the chip backside and the carrier topside comprises permanently magnetic structures.

* * * * *